United States Patent [19]
Nishi

[11] Patent Number: 4,952,815
[45] Date of Patent: Aug. 28, 1990

[54] FOCUSING DEVICE FOR PROJECTION EXPOSURE APPARATUS

[75] Inventor: Kenji Nishi, Kawasaki, Japan

[73] Assignee: Nikon Corporation, Tokyo, Japan

[21] Appl. No.: 335,428

[22] Filed: Apr. 10, 1989

[30] Foreign Application Priority Data

Apr. 14, 1988 [JP] Japan ................................. 63-91953
Apr. 25, 1988 [JP] Japan ................................ 63-101924

[51] Int. Cl.$^5$ ............................................. G01N 21/86
[52] U.S. Cl. ..................................... 250/548; 356/400
[58] Field of Search ................ 250/548, 557; 356/399, 356/400, 401

[56] References Cited

U.S. PATENT DOCUMENTS

| | | | |
|---|---|---|---|
| 4,558,949 | 12/1985 | Uehara et al. | 356/152 |
| 4,650,983 | 3/1987 | Suwa | 250/204 |
| 4,780,616 | 10/1988 | Nishi et al. | 250/548 |
| 4,794,426 | 12/1988 | Nishi | 356/400 |
| 4,829,193 | 5/1989 | Nishi | 250/557 |
| 4,856,905 | 8/1989 | Nishi | 250/548 |

*Primary Examiner*—David C. Nelms
*Assistant Examiner*—Que Tan Le
*Attorney, Agent, or Firm*—Shapiro and Shapiro

[57] ABSTRACT

A projection exposure apparatus for projecting the image of an object on a first plane onto a second plane through a projection optical system, comprising: reference mark device provided in the vicinity of said second plane; illumination device for illuminating said reference mark device from a side opposite to said projection optical system with respect to said second plane; separation device for separating an illuminating light beam, transmitted by said reference mark device and forming the image of said reference mark device in the vicinity of said first plane through said projection optical system, into two light beams respectively passing through mutually different two areas in the pupil of said projection optical system; detection device comprising at least a pair of light receiving elements respectively receiving said light beams separated by said separation device and releasing signals corresponding to the intensities of said light beams; and position control device for detecting the position of the image plane of said projection optical system with respect to said reference mark device, based on the output signals of said detection device, and varying the optical path length between said first plane and said reference mark device.

10 Claims, 10 Drawing Sheets

FOCUSING DEVICE FOR PROJECTION EXPOSURE APPARATUS

BACKGROUND OF THE INVENTION

1. Field of the Invention

The present invention relates to an aligning device for a projection exposure apparatus for semiconductor device manufacture, and more particularly to a focusing device for alignment in the axial direction of the projection lens.

2. Related Background Art

So-called stepper, or a reduction projection exposure apparatus of step-and-repeat type employed principally in the photolithographic process for semiconductor device manufacture, exposes a photosensitive substrate (hereinafter called wafer) to a circuit pattern formed on a mask or a reticle (hereinafter collectively called reticle) through a projection lens. Unless the projected image of the circuit pattern of the reticle is correctly focused on the wafer, the resulting image becomes blurred and cannot provide sufficient resolution. Such stepper employs a projection lens of a large numerical aperture (N. A.) for obtaining a high resolving power. The numerical aperture of the projection lens has been increased, corresponding to the minimum line width of the submicron circuit pattern, so that the practical depth of focus has become very small.

Also a prolonged exposure operation results in a temperature rise in the projection lens due to the absorption of irradiation energy therein, and the image plane of the projection lens may vary in the axial direction due to the temperature change of said projection lens, or the energy accumulation therein. Thus insufficient resolution is encountered on the wafer unless the projected image of the circuit pattern of the reticle is exactly focused on the wafer.

In order to obtain a semiconductor integrated circuit of desired characteristics, it is essential to exactly align the focal plane of the projection lens with the surface of the wafer. For achieving such focusing performance, there is disclosed a device for example in the U.S. Pat. No. 4,650,983. Such device is provided with so-called through-the-lens (TTL) optical system for detecting a first mark on the reticle and detecting a second mark on the wafer through the projection lens, and is so designed as to effect the focusing for said first mark by adjusting said first mark detecting optical system, and to effect the focusing for said second mark by axially varying the distance between the wafer and the projection lens. Consequently the reticle is always maintained conjugate with the wafer with respect to the projection lens, and the projected image of the circuit pattern of the reticle is always formed in a bast focus state on the wafer.

However, in such device, in the focusing operation by varying the distance between the wafer and the projection lens in the axial direction, it is necessary to move the wafer stepwise by an amount Δn and to detect the contrast of the image of the second mark at each position of the wafer by means of the TTL optical system. Similar measurements are also required in the focusing of the TTL optical system with the reticle. Consequently the throughput is deteriorated because the focusing requires time.

Also in such device, the first mark on the reticle is associated with the pattern area, corresponding to the peripheral area in the exposure field of the projection lens, so that the state of focus is always detected in such peripheral part of the exposure field. Consequently the focus state at the central part of the exposure field cannot be detected, and the image plane curvature of the projection lens cannot be measured. For this reason, a test exposure has to be made in order to measure the image plane curvature. Besides, the focus position is usually detected at the position of a rectangular mark extended in the sagittal direction (S-direction) on the reticle, but thus detected focus position in the sagittal direction is offset from the focus position detected from a rectangular mark extended in the meridional direction (M-direction), due to the astigmatism of the projection lens. This phenomenon deteriorates the precision of detection of the focus position, and the limit of resolution of the projection lens considered in the focus position in the sagittal and meridional directions is reduced. Furthermore, such device is unable to control the surface position of the wafer in response to the change of the image plane resulting from the accumulation of the irradiation energy in the projection lens, and the imaging performance at exposure is deteriorated due to such defocus, image plane curvature or image plane inclination.

In the exposure apparatus disclosed in the above-mentioned U.S. Pat. No. 4,650,983, the second mark on the wafer is illuminated through the projection lens, and the reflected light is detected again through the projection lens. Thus the passing of the illuminating light through the projection lens twice not only causes accumulation of the irradiation energy in the projection lens but also induces a significant loss of the light intensity, thereby eventually deteriorating the focusing precision. In order to prevent such drawback, the Japanese Laid-open Patent Sho No. 63-70104, corresponding to the U.S. Pat. Application Ser. No. 94,448 filed Sept. 9, 1987, discloses an optical device in which the second mark is illuminated from the rear side, and the light transmitted by said second mark is detected through the projection lens. In such known device, the pupil of the projection lens is divided into two portions, and the transmitted light is detected by shielding one of thus divided two portions. Consequently the detection of the best focus position requires a long time, as the shielded portion has to be switched at each detection.

SUMMARY OF THE INVENTION

In consideration of the foregoing, an object of the present invention is to provide a projection exposure apparatus capable of achieving precise focusing within a short time.

Another object of the present invention is to provide a projection exposure apparatus capable of detecting the focus position without offsetting and setting the wafer surface at the optimum exposure position precisely within a short time, following the movement of the image plane according to the heat accumulation in the projection lens, thereby constantly enabling exposure in the best focus state.

The present invention is based on a principle that a light beam, containing a principal ray inclined to the optical axis of the projection lens will cause a shift in the focal position of the projection lens at the reticle side, in a direction perpendicular to said optical axis on the patterned surface of the reticle, if the conjugate relationship between the reticle and a reference member on the wafer stage is destructed. Thus a fiducial mark is irradiated with light which can be divided, by a polarizing filter, into P-polarized light and S-polarized light (ordinary ray and extraordinary ray) of different polarization characteristics, and the reticle alignment mark is scanned with the projected image of said fiducial mark. The illuminating light transmitted by the reticle without being intercepted by the reticle alignment mark is divided into the P-polarized light and S-polarized light by a polarizing beam splitter, and these polarized lights are respectively received by first and second detectors. Thus the focusing can be achieved by the calculation of axial amount of defocus between the reticle and the reference member by a single scanning motion of the wafer stage in the X-direction, so that the time required for focusing can be reduced.

The present invention enables precise detection of the amount of defocus in an extremely short time, as the position of focus can be detected without switching of divided two areas.

The projection exposure apparatus is further provided with memory means for storing, in advance, the characteristic of the axial variation of the image plane of the projection lens according to heat accumulation in the projection lens caused by the energy entering said lens, and means for identifying the state of the image plane of the projection lens based on the focal position at least at a point in the image plane of said projection lens detected by said focal position detecting means and on the axial variation characteristic stored in said memory means, and controlling the position of the photosensitive substrate with respect to the projection lens according to said state of image plane.

Thus, the exposure can always be conducted at the best focus state since, even if the state of the image plane of the projection lens varies according to the heat accumulation in the projection lens, the position of the photosensitive substrate can be corrected by high-speed detection of the state of said image plane.

Still other objects of the present invention, and the advantages thereof, will become fully apparent from the following description to be taken in conjunction with the attached drawings.

DESCRIPTION OF THE PREFERRED EMBODIMENTS

Figure 1:
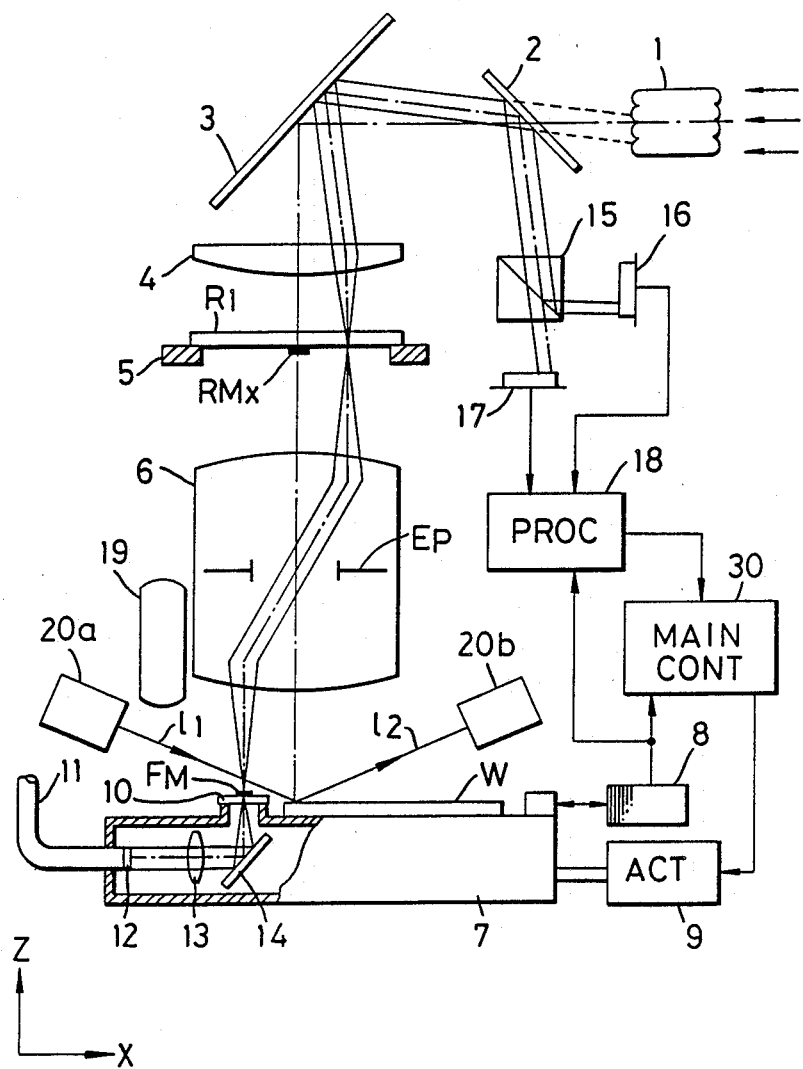
FIG. 1 is a schematic view of a projection exposure apparatus, constituting a first embodiment of the present invention.

Now the present invention will be clarified in detail by embodiments thereof shown in the attached drawings. FIG. 1 schematically illustrates a stepper constituting a first embodiment of the present invention.

Figure 2:
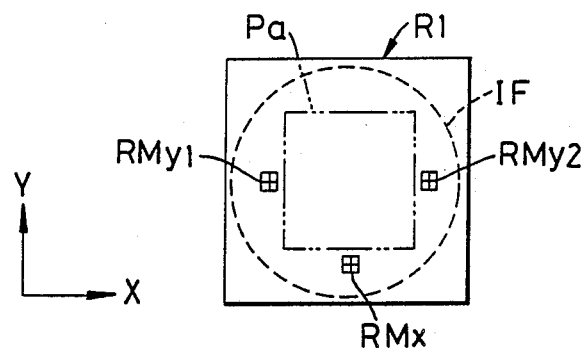
FIG. 2 is a schematic plan view of a reticle to be employed in the first embodiment.

Referring to FIG. 1, an unrepresented exposure light source emits illuminating light of a wavelength actinic to photoresist, such as g-line or i-line. Said illuminating light is transmitted by a fly's eye lens 1 and a beam splitter 2 retractable from the path of the illuminating light, then reflected by a mirror 3 and enters a condenser lens 4, thereby illuminating a pattern area of a reticle R supported by a reticle stage 5 with a uniform illumination intensity. Said reticle R1 is provided, as shown in FIG. 2, with slignment marks RMx, RMy1, RMy2 each having a crosshair formed with a chromium layer in a transparent window, associated with the pattern area Pa and positioned within an exposure field IF of a projection lens 6. The projection lens 6 of a telecentric structure on one side or on both sides projects the images of a circuit pattern of the pattern area Pa and of the alignment marks of the reticle R1 onto a wafer W coated with photoresist. Said alignment marks may be shielded, at the exposure operation, with unrepresented reticle blinds.

The wafer W is supported, through an unrepresented wafer holder (θ-table), on the wafer stage 7, of which position in the X-direction is detected by a laser interferometer 8. The wafer stage 7, driven by an actuator 9 in the X, Y and Z-directions, is provided thereon with a reference member having a fiducial mark FM. Said reference member is composed for example of a glass plate, of which upper surface lies in the same plane as that of the wafer surface. The fiducial mark FM consists of translucent slit marks FMx, FMy (not shown) for focusing and a diffraction grating mark (not shown) formed with patterns of reflective chromium layer, employed for detection of position for example with an off-axis wafer alignment system 19. Said fiducial mark FM is illuminated from below, through a lens 13 and a mirror 14, by means of the illuminating light of g-line, i-line etc. transmitted below the reference member 10 through a light tube 11 consisting of optical fibers (hereinafter called fibers).

Figure 3:
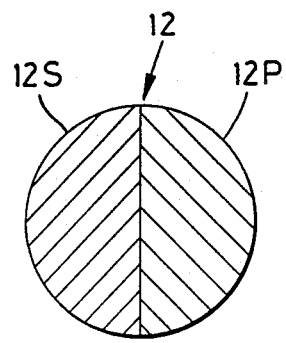
FIG. 3 is a schematic plan view of a polarizing filter incorporated in the first embodiment.

The optical fibers 11 are provided at the end face thereof, with a polarizing filter 12, which is divided, as shown in FIG. 3, into a filter portion 12p for transmitting the P-polarized light only, and a filter portion 12s for trnasmitting the S-polarized light only, and positioned conjugate with the pupil Ep of the projection lens 6. Thus the principal ray of the P-polarized beam transmitted by the filter portion 12p passes through the fiducial mark FM with an inclination $\theta_1$ with respect to the optical axis of the projection lens, while the principal ray of the S-polarized beam transmitted by the filter portion 12s passes through the fiducial mark FM with an inclination $\theta_2$ with respect to said optical axis.

The polarized lights transmitted by the fiducial mark FM are concentrated on the pattern bearing surface of the reticle R1 by the projection lens 6, and, after being transmitted by the reticle R1, are transmitted by the condenser lens 4, mirror 3 and beam splitter 2. They are then separated by the polarizing beam splitter 2 into the P-polarized light and S-polarized light, and are respectively received by the first detector 16 and the second detector 17.

The off-axis wafer alignment system 19 projects a light beam extended in the Y-direction onto an unrepresented diffraction grating mark (wafer mark) formed on the wafer W in combination with a small movement of the wafer stage 7 in the X-direction, thereby detecting the position of said wafer mark in the X-direction.

Also there is provided a focus detecting system consisting of an illuminating optical system 20a for irradiating the image plane of the projection lens 6 with an oblique light beam $l_1$, and a receiving optical system 20b for receiving a reflected light beam $l_2$. This focus detecting system will not be explained in detail as its structure is disclosed in the aforementioned U.S. Pat. No. 4,650,983, but it serves to detect the vertical position of the wafer surface with respect to a reference plane, thereby detecting the focus state between the wafer and the image plane of the projection lens 6.

A main control unit 30 performs the position control of the wafer stage 7 in the Z-direction based on the output signals of the first and second detectors 16, 17, and also controls the functions of the entire apparatus including the wafer alignment system 19 and focus detecting system 20.

In the following there will be explained the functions of the first embodiment described above. The main control unit 30 moves the wafer stage 7 in the X-direction in order to detect the above-mentioned inclinations $\theta_1$, $\theta_2$, and places the reference member 10 at a predetermined position (coordinate $Z_1$) by means of the focus detecting system 20. Then the reference member 10 is illuminated from the lower side with the illuminating light transmitted by the optical fibers 11, thereby forming a projected image FMx' of the fiducial mark FMx, as shown in FIG. 4, on the pattern bearing surface of the reticle R1.

Figure 4:
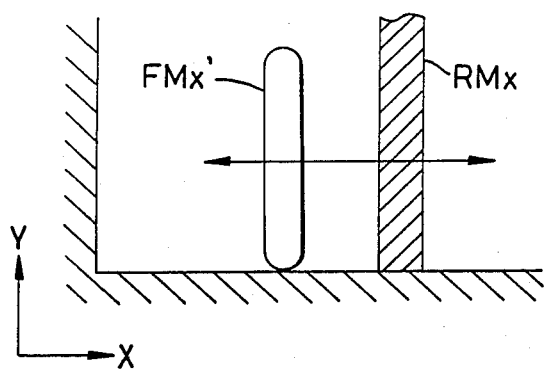
FIG. 4 is a schematic view showing the mode of scanning of a reticle alignment mark with a projected image of a fiducial mark.

The wafer stage 7 is moved by a small amount in the X-direction in such a manner that said projected image FMx' scans, in a relative motion in the X-direction as shown in FIG. 4, a rectangular mark extended in the Y-direction of the mark RMx on the reticle R1. The light transmitted by the reticle R1 is guided through the condenser lens 4, mirror 3 and beam splitter 2 and is separated, in the polarizing beam splitter 15, into the P-polarized light and the S-polarized light, which are respectively received by the first detector 16 and the second detector 17. The amount of light transmitted by the reticle R1 is minimum when the projected image FMx' coincides with the mark RMx, but becomes larger as the displacement between said image and mark increases.

Said P-polarized light and S-polarized light are photoelectrically converted by said first and second detectors 16, 17, and the obtained photoelectric signals are supplied to a wave form processing unit 18. Said processing unit 18 processes said photoelectric signals in synchronization with a position signal, indicating the position of the wafer stage 7, obtained from the laser interferometer 8, and sends, to the main control unit 30, a signal $S_1$ corresponding to the P-polarized light and a signal $S_2$ corresponding to the S-polarized light. In said signals $S_1$ and $S_2$, a indicates a position where the projected image FMx' formed with the P-polarized light coincides with the mark RMx, and b indicates a position where the projected image FMx' formed with the S-polarized light coincides with the mark RMx. The main control unit 30 detectes and stores the coordinates $X_{p1}$, $X_{s1}$ of said positions a, b in the X-direction.

Figure 6:
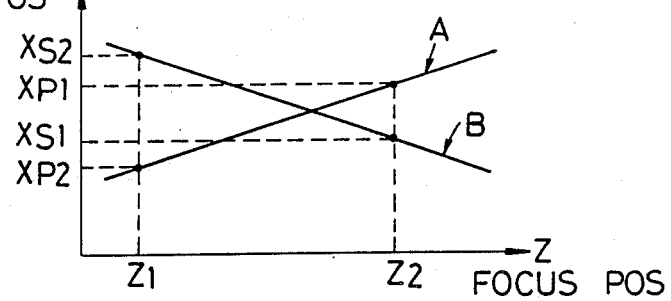
FIG. 6 is a chart showing the relationship between the distance of signals shown in FIG. 5 and the focal position.

Then the actuator 9 is activated to move the wafer stage 7 in the Z-direction, thus placing the reference member 10 at a predetermined position (coordinate $Z_2$), then there are determined positions where the mark RMx coincides with the projected image FMx' in a similar manner as explained above, and corresponding coordinates $X_{p2}$, $X_{s2}$ are stored. FIG. 6 illustrates the relation between the focus position in the Z-direction and the positions of said coincidence.

In FIG. 6, the inclinations of lines A, B with respect to the Z-axis respectively correspond to the inclinations $\theta_1$, $\theta_2$ of the principal rays of the P- and S-polarized lights with respect to the optical axis. The main control unit 30 memorizes said inclinations $\theta_1$ and $\theta_2$. For the purpose of improving the precision, it is preferable to effect the above-explained operation, namely the detection of position of coincidence between the mark RMx and the projected image FMx' plural times at an arbitrary focus position, and to store the averaged inclinations of the lines.

In the focusing operation, the main control unit 30 moves the wafer stage 7 in the Z-direction and places the surface of the reference member 10 at a predetermined reference position (co-ordinate Zn) by means of the focus detecting system 20. Then, as in the detecting operation for the inclinations $\theta_1$, $\theta_2$, the fiducial mark FMx is illuminated from the lower side with the illuminating light transmitted by the optical fibers 11 and transmitted by the polarizing filter 12, and the wafer stage 7 is moved by a small amount in the X-direction in such a manner that the projected image FMx' of said fiducial mark scans the rectangular mark, extended in the X-direction, of the mark RMx in a relative motion in the X-direction as shown in FIG. 4.

Figure 5:
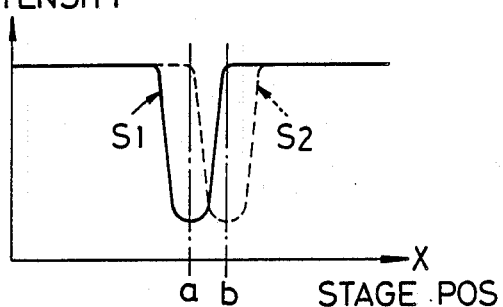
FIG. 5 is a wave form chart showing a signal obtained by the detection of a change in the light amount with a detector in synchronization with the position signal of the wafer stage.
Figure 7:
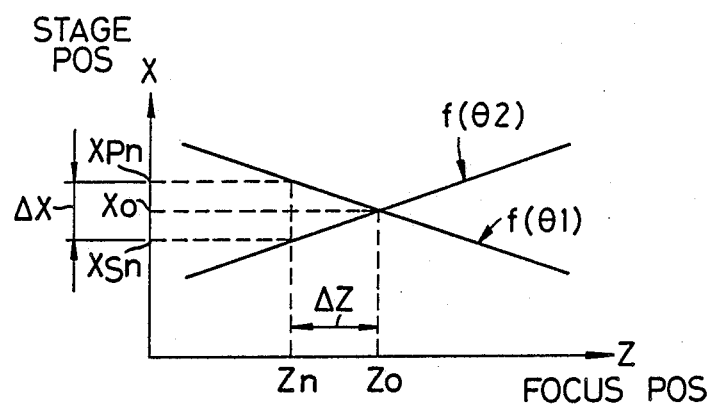
FIG. 7 is a chart showing the principle of defocus detection and base line measurement.

The illuminating light transmitted by the reticle R1 is guided by the beam splitter 2 and is divided, in the polarizing beam splitter 15, into the P-polarized light and the S-polarized light, which are respectively received by the first and second detectors 16, 17. In response to the photoelectric signals from the first and second detecting 16, 17 and the position signal from the laser interferometer 8, the processing unit 8 sends signals similar to $S_1$, $S_2$ shown in FIG. 5, to the main control unit 30. In response the main control unit 30 determines positions $X_{pn}$, $X_{sn}$ where the projected image FMx' of the fiducial mark FMx coincides with the mark RMx, as shown in FIG. 7, in which lines $f(\theta_1)$ and $f(\theta_2)$ indicate characteristics determined in advance in the operations shown in FIGS. 4 to 6.

Then the amount of defocus $\Delta Z$ between the reticle R1 and the reference number 10 is determined according to the following equation (1), based on the displacement $\Delta X$ of the positions of coincidence of the projected image FMx' and the mark RMx ($\Delta X = X_{pn} - X_{sn}$) and the inclinations $\theta_1$, $\theta_2$:

$$\Delta Z = \frac{\Delta X}{\tan(\theta_1 + \theta_2)} \quad (1)$$

The main control unit 30 moves the wafer stage 7 by the actuator 9 in the Z-direction in such a manner that the detected value at the position (coordinate Zn) of the focus detecting system 20 varies by the defocus amount $\Delta Z$ whereby the reticle R becomes conjugate with the reference member 10 with respect to the projection lens 6. Thus the reticle R1 and the reference member 10 are set in mutually conjugate positions with respect to the projection lens 6, and the surface of the reference member 10 or the wafer W precisely coincides with the image plane of the projection lens 6. The focusing operation, or the alignment in the Z-direction, is thus completed.

In the following there will be explained the focusing operaiton when the wafer W is associated for example with a photoresist layer of uneven thickness. At first the main control unit 30 effects calibration of the focus position of the focus detecting system 20, by means of the reference member 10 positioned at the image plane of the projection lens 6. The calibration of the focus detecting system 20 will be explained in the following only briefly, as it is detailedly disclosed in the aforementioned U.S. Pat. No. 4,650,983.

The irradiating optical system 20a irradiate the reference member 10 with an oblique parallel light beam through a slit aperture or parallel flat glass plates (not shown), thus forming a slit image on said reference member 10, and the receiving optical system 20b receives the parallel beam reflected from the reference member 10 with a photosensor, through unrepresented oscillating mirror, slit plate etc. In said receiving optical system 20b, said slit image vibrates with a predetermined amplitude on the slit plane corresponding to the motion of the oscillating mirror, and the center of vibration on said photosensor is shifted according to the position, in the Z-direction of the reference member 10.

Thus the angle of the parallel flat glass plates is so adjusted that the center of vibration of the slit image on the slit plate coincides with the slit aperture. There is thus completed the calibration of the focus detecting system 20, taking the surface of the reference member 10 or the image plane of the projection lens 6 as the zero point. It is also possible to calibrate the focus detecting system 20, instead of utilizing the reference member 10 positioned at the coordinate value $Z_0$ by the movement of the wafer stage 7 in the Z-direction by the defocus amount $\Delta Z$, by utilizing the reference member 10 at the coordinate value Zn wherein the defocus amount $\Delta Z$ is detected, by adjusting the angle of the parallel flat glass plates so as to generate an offset corresponding to the defocus amount $\Delta Z$.

Then the wafer stage 7 is moved to a predetermined exposure start position, and the exposure operation is started after the wafer W is thus positioned. The main control unit 30 causes the focus detecting system 20 to detect the position, in the Z-direction, of the exposure area of the wafer W, and moves the wafer stage 7 in the Z-direction, in response to the output signal of the focus detecting system 20, in such a manner that the difference between thus detected position and the zero point becomes equal to zero. Thus the circuit pattern of the reticle R1 is projected in the best focus state on the exposure area of the wafer W, so that the exposure can be executed without insufficient resolution resulting from defocus.

Subsequently the wafer stage 7 is stepped by a predetermined amount, and the circuit pattern of the reticle R1 is transferred onto the wafer W after a similar focusing operation with the focus detecting system 20. Thus the focusing operation with the focus detecting system 20 for each exposure area prevents insufficient resolution resulting for example from uneven thickness of the photoresist layer, thus enabling exposure in the best focus state over the entire surface of the wafer W.

In the present embodiment, the optical fibers 11 may be replaced for example with a relay optical system or mirrors, for illuminating the fiducial mark FM.

As explained above, the present embodiment, being capable of detecting the absolute amount $\Delta Z$ of defocus by a single scanning motion of the wafer stage 7, can reduce the time required for focusing and enables the exposure operation always in the best focus state.

In FIG. 6, the crossing point of the lines A and B indicates a position where the projected image FMx' is not shifted, namely a focused position where the defocus amount $\Delta Z$ between the reticle R1 and the reference member 10 becomes equal to zero. Consequently a rapid focusing operation can be achieved, as in the foregoing embodiment, by moving the wafer stage 7 in the Z-direction according to the defocus amount $\Delta Z$ determined from said focused position, simultaneously with the detection of the inclinations $\theta_1$, $\theta_2$.

Also, in the conventional projection exposure apparatus, the so-called baseline measurement, for determining the relative positional relationship beween the mark detecting center of the off-axis wafer alignment system 19 and the projected image of a reference point (such as reticle alignment mark) on the wafer, has to be conducted after the focusing operation, since the measrued position involves an offset in an unfocused stage, if the principal ray of illuminating light employed in the position measurement of the reticle alignment mark is inclined to the optical axis of the projection lens for example by an error in the manufacture.

However the foregoing embodiment enables the baseline measurement simultaneously with the focusing operation. More specifically, the mark RMx is scanned with the projected image FMx' of the fiducial mark RMx at a predetermined reference position (coordinate value Zn) as shown in FIG. 4. Thus, lines as shown in FIG. 7 can be obtained from the positions $X_{pn}$, $X_{sn}$ where the projected image FMx' coincides with the mark RMx, determined from the signals obtained from the processing unit 18, and from the inclinations $\theta_1$, $\theta_2$.

Consequently the focusing can be achieved by moving the wafer stage 7 in the Z-direciton by the defocus amount $\Delta Z$ ($=Z_0-Z_n$) determined from the Z-position of the crossing point of the lines $f(\theta_1)$ and $f(\theta_2)$.

The coordinate value $X_0$ of the crossing point, detected simultaneously with the focused position (coordinate value $Z_0$), indicates the position of coincidence of the projected image FMx' and the mark RMx in the focused position. In this manner the position of the mark RMx can be exactly determined without the error resulting from defocus, simultaneously with the detection of the defocus amount $\Delta Z$, so that the focusing operation need not be conducted prior to the baseline measurement. The baseline can be measured from thus detected position of the mark RMx and the position of detecting center of the wafer alignment system 19, detected with a diffraction grating mark formed on the reference member 10, so that the time required for baseline measurement can also be reduced.

In the foregoing embodiment, the defocus amount $\Delta Z$ is detected by means of and at the position of the rectangular mark, extended in the Y-direction or sagittal direction (S-direction), of the mark RMx provided in the exposure field IF of the projection lens 6 shown in FIG. 2. The detection of the defocus amount $\Delta Z$ with the rectangular mark, extended in the sagittal direction, of the mark RMx as in the foregoing embodiment may provide a different result from that of the detection with a rectangular mark, extended in the X-direction or meridional direction (M-direction), due to the eventual difference in the image position at the reticle side of the optical axis, resulting from astigmatism of the projection lens 6. Consequently the detection only with the rectangular mark extended in the sagittal direction may result in an offset.

Figure 8:
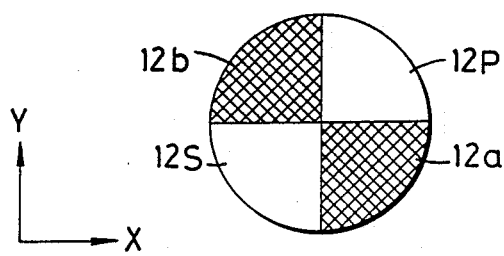
FIG. 8 is a plan view of a filter different from that shown in FIG. 3.

In order to avoid such phenomenon, the polarizing filter 12 is rotated by 45° on the end face of the optical fibers 11 in such a manner that the dividing direction of said filter 12, shown in FIG. 3, is inclined by 45° in the X—Y plane. The rectangular mark, extended in the sagittal direction, of the mark RMx is scanned once in the X-direction with the projected image FMx' of the mark FMx as shown in FIG. 4 to determine a defocus amount $\Delta Z_s$, and a rectangular mark, extended in the meridional direction, of the mark RMx is scanned once in the Y-direciton with the projected image of an unrepresented mark FMy to determine a defocus amount $\Delta Z_m$. The offset resulting from the astigmatism of the projection lens 6 can be prevented by determining the amount of defocus $\Delta Z$ from the foregoing results at a predetermined reference position (coordinate value Zn). Also a polarizing filter divided into four portions, as shown in FIG. 8, consisting of mutually opposed opaque area 12a, 12b and mutually opposed polarizing areas 12p, 12s naturally provides a similar effect as in the polarizing filter 12 shown in FIG. 3 when it is rotated by 45°.

Figure 9:
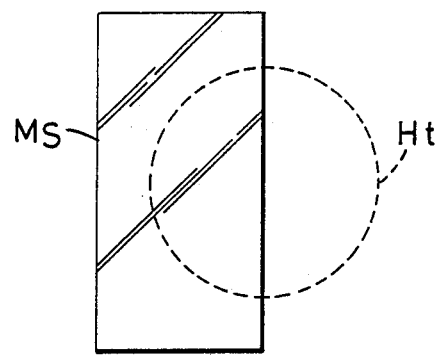
FIG. 9 is a schematic plan view of the arrangement of optical members for dividing the light passing through the pupil of the projection lens into two portions.

It is also possible to detect the defocus amount $\Delta Z$ at each position with the reticle mark without the polarizing filter, by providing, as shown in FIG. 9, a mirror Ms dividing the image of pupil Ht in the X-direction, and receiving the divided two light beams respectively with detectors.

A similar effect can also be obtained by replacing said mirror Ms with a photosensor divided into four portions, for receiving the light beam transmitted by the reticle R in divided manner respectively in the X- and Y-directions.

It is furthermore possible to provide the above-mentioned mirror Ms in a 45° rotated position, with respect to the X- or Y-direciton at a position conjugate with the pupil of the projection lens so as to divide the image of the pupil into two portions with respect to a direction of 45° with respect to the X- or Y-direction, thereby determining the defocus amount $\Delta Z$ at the position of the reticle mark RMx, from the defocus amounts $\Delta Z_s$ and $\Delta Z_m$. It is therefore possible to prevent the offset resulting from the astigmatism of the projection lens 6 and to precisely detect the amount of defocus, even in case of measurement without the polarizing filter.

Figure 10:
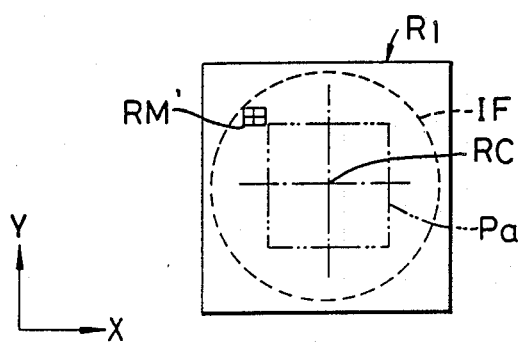
FIG. 10 is a plan view of a reticle different from that shown in FIG. 2.

In case the reticle alignment mark RM' is provided, as shown in FIG. 10, in a direction of 45° in the X—Y coordinate system from the center RC of the reticle, there has to be considered, on the illuminating light passing through the fiducial mark FM, the inclination of the principal ray in the sagittal direction and the meridional direction at said mark RM'. It is therefore possible to determine the defocus amount $\Delta Z$, without the polarizing filter, from the defocus amounts $\Delta Z_s$, $\Delta Z_m$ obtained in a single scanning and to prevent the offset resulting from astigmatism, by providing two receiving optical systems, each composed of the above-mentioned mirror Ms and two detectors for receiving the illuminating light transmitted by the mark RM', so as to divide the pupil image Ht respectively in the sagittal and meridional directions, namely in directions of 45° with respect to the X—Y coordinate system, and by scanning the mark, extended in the Y-direction, of the reticle mark RM' with the projected image of the mark FMx.

Figure 11:
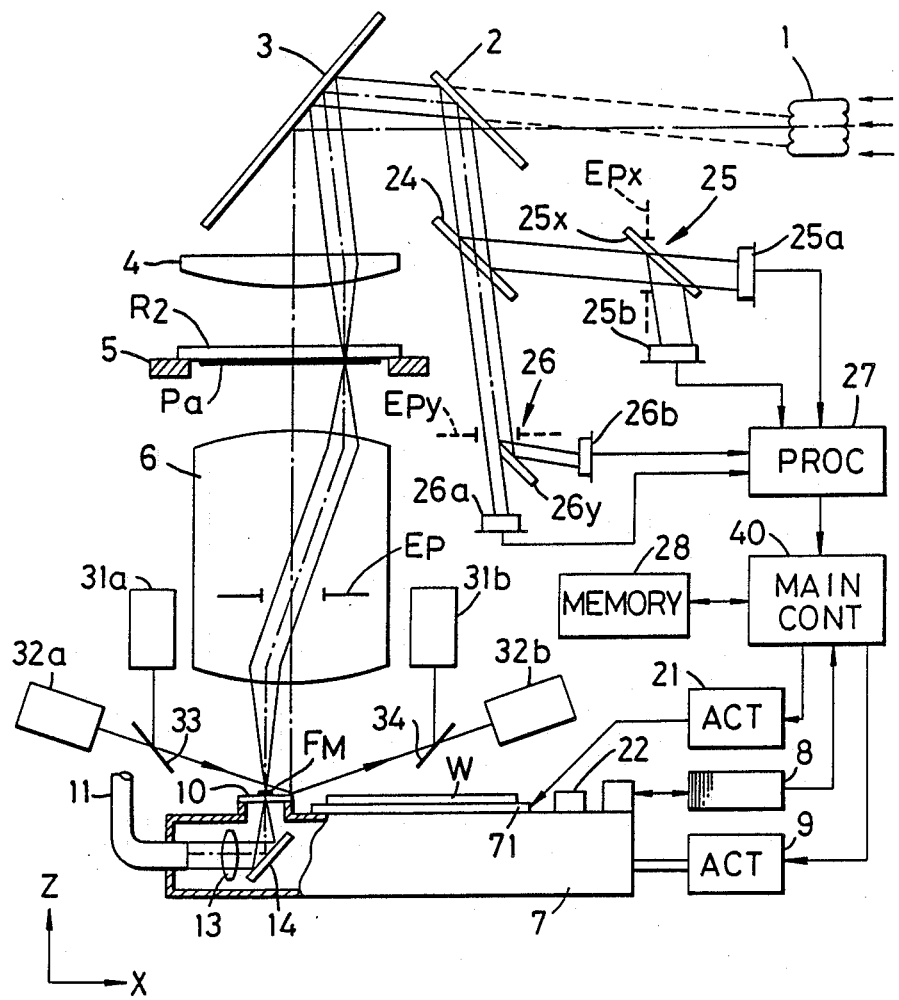
FIG. 11 is a schematic view of a projection exposure apparatus constituting a second embodiment of the present invention.

In the following there will be explained a second embodiment of the present invention, in which the focus state is detected by separating the light beam, transmitted by the pupil Ep of the projection lens 6, with a dividing optical system. FIG. 11 is a schematic view of a stepper having the focusing function constituting the second embodiment of the present invention, wherein components equivalent to those in FIG. 1 are represented by same symbols or numbers. A reticle R2 is provided with alignment marks RMb-RMe, each composed of a crosshair mark formed in a transparent window of a chromium layer, and said marks are associated with the pattern area Pa and positioned in the exposure field IF of the projection lens 6.

Figure 13:
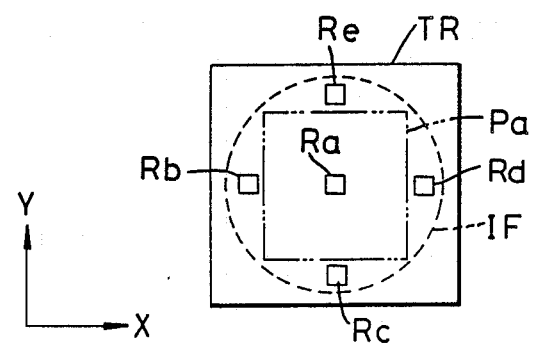
FIG. 13 is a schematic plan view of a test reticle.
Figure 14:
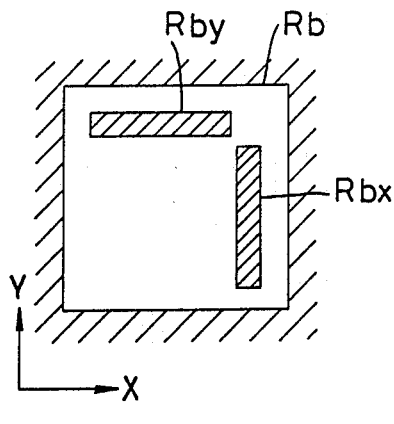
FIG. 14 is a schematic plan view of a reticle mark employed in detection of focal position.

FIG. 13 schematically shows a test reticle TR, in which reticle marks Rb-Re are positioned in the exposure field IF of the projection lens 6, respectively corresponding to the alignment marks RMb-RMe of the reticle R2, and a reticle mark Ra is formed at the center of the test reticle TR. Each of said reticle marks Ra-Re, for example the reticle mark Rb, is provided, as shown in FIG. 14, with rectangular marks Rbx, Rby formed with a chromium layer and respectively extended in the X- and Y-directions in a transparent window.

The wafer W is supported, through an unrepresented wafer holder ($\theta$-table), by a tilting stage (hereinafter called levelling stage) 71, which is provided on the wafer stage 7 and can be titled in an arbitrary direction by an actuator 21. On the wafer stage 7 there is provided a photoelectric detector 22 for detecting the amount of exposure light transmitted by the projection lens 6. The size of the light-receiving face of said detector is selected equal to or larger than the projected image of the pattern area Pa of the reticle R2, for receiving all the exposing light beam passing through the reticle R2 and the projection lens 6.

As in the first embodiment, the fiducial mark FM is illuminated from the lower side with the light of exposing wavelength, and a projected image of said fiducial mark FM is formed on the pattern bearing surface of the reticle R2. The light transmitted by the reticle R2 enters a half mirror 24 through the condenser lens 4 and the beam splitter 2, and two light beams split by said half mirror 24 reach light dividers 25x, 26y, composed for example of mirrors and provided at positions $E_{px}$, $E_{py}$ substantially conjugate with the pupil Ep of the projection lens 6.

Figure 15:
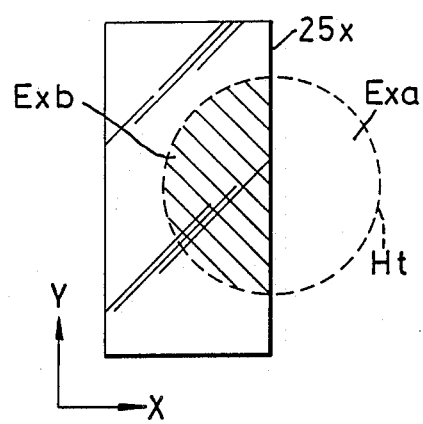
FIG. 15 is a plan view of arrangement of dividing optical members employed, in the embodiment shown in FIG. 11, for the detection of focus position with a mark extended in the Y-direction.

As shown in FIG. 15, the light divider 25a divides the image Ht of the pupil of the projection lens 6 in the X-direction, and the divided illuminating light beams $E_{xa}$, $E_{xb}$ are respectively received by detectors 25a, 25b. The first focus position detecting system 25, consisting of said light divider 25x and detectors 25a, 25b, is used in the detection of focus position, with the mark portion, extended in the Y-direction, of the reticle alignment crosshair marks RM.

Figure 16:
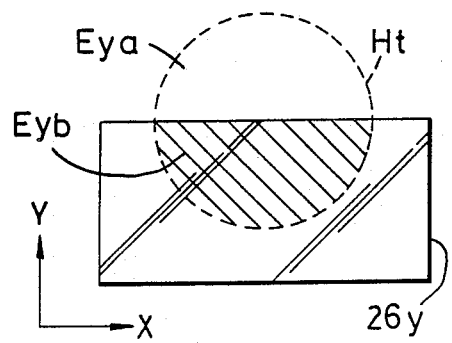
FIG. 16 is a plan view of arrangement of dividing optical members employed, in the embodiment shown in FIG. 11, for the detection of focus position with a mark extended in the X-direction.

Similarly, as shown in FIG. 16, the light divider 26y divides the pupil image Ht in the Y-direction, and the divided illuminating light beams $E_{ya}$, $E_{yb}$ are respectively received by detectors 26a, 26b. The second focus position detecting system 26, consisting of said light divider 26y and detectors 26a, 26b, is used in the detection focus position, with the mark portion, extended in the X-direction, of the reticle alignment crosshair marks RM.

In FIG. 11, an irradiating optical system 31a and a receiving optical system 31b, constituting a focus detecting system, correspond to the optical systems 20a, 20b shown in FIG. 1.

There is further provided a horizontal position detecting system 32, consisting of an irradiating optical system 32a for emitting a laser beam through a beam splitter 33 obliquely with respect to the optical axis of the projection lens, and a receiving optical system 32b for receiving said beam, after reflection on the wafer surface, through a beam splitter 34. Such horizontal position detecting system 32 is used for detecting the levelling of the wafer surface and is already disclosed in the U.S. Pat. No. 4,558,949. The beam splitter 2 is composed of a switchable mirror, retractable from the optical path by means of an unrepresented actuator. In practice it is preferably provided with a beam splitting area of a reflectance of several per cent and a wholly reflecting area, in such a manner that said beam splitting area or said wholly reflecting area is selected respectively in the detection of wafer reflectance or in the detection of focus detection according to the present embodiment.

In the following there will be explained the functions of the second embodiment explained above. At first the test reticle TR is mounted on the reticle stage 5. At first a control unit 40 functions to detect the characteristics of variation in the focus position, namely the focus position at a predetermined point on the image plane of the projection lens 6, corresponding to suitable levels of heat accumulation, utilizing the test reticle shown in FIG. 13. At first it executes the focus position detection utilizing the reticle mark Rb shown in FIG. 14, namely the detection of defocus amount $\Delta Z$ between the reticle Rb of the test reticle TR and the fiducial mark FM of the reference member 10, in the direction of optical axis of the projection lens 6. In this operation, a rotary shutter (not shown) provided in the path of the exposure light is used to close said light path, thereby preventing the exposure light from entering the projection lens 6.

Then the main control unit 40 moves the wafer stage 7 by means of the actuator 9 in the Z-direction, and places the reference member 10 at a predetermined position (coordinate value $Z_1$) utilizing the focus detecting system 31. The reference member 10 is illuminated from the lower side with the illuminating light transmitted through the optical fibers 11, thus forming the projected image FMx' of the fiducial mark FMx on the pattern-bearing surface of the test reticle TR.

Figure 17:
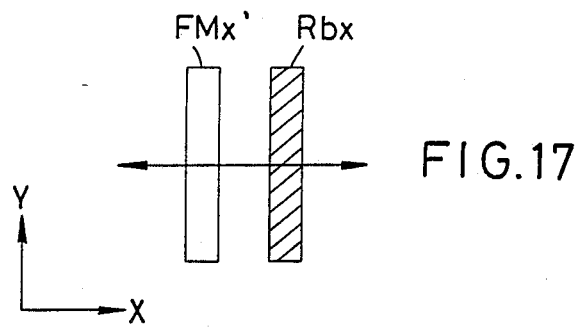
FIG. 17 is a schematic view showing the mode, in the embodiment shown in FIG. 11, of scanning of the reticle mark with the projected image of the fiducial mark.

Then the wafer stage 7 is moved in the X-direction so as that, as shown in FIG. 17, the mark Rbx is scanned by the projected image FMx' in a relative motion in the X-direction. The illuminating light transmitted by the test reticle TR is guided by the condenser lens 4, mirror 3 and beam splitter 2, and enters the half mirror 24. The light reflected by said half mirror 24 enters the first focus position detecting system 25 and is therein divided in the X-direction into two light beams, which are respectively received by the detectros 25a, 25b.

Figure 18:
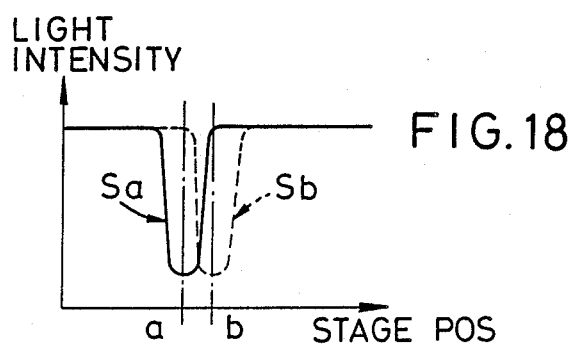
FIG. 18 is a wave form chart showing a signal obtained, in the embodiment shown in FIG. 11, by the detection of a change in the light amount with a detector in synchronization with the position signal of the wafer stage.
Figure 19:
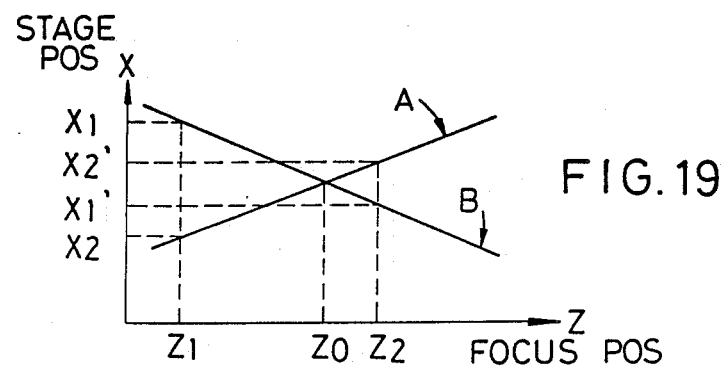
FIG. 19 is a chart showing the principle of detection of defocus amount.

The light amount transmitted by the test reticle TR becomes minimum when the projected image FMx' coincides with the mark Rbx, and becomes larger as the displacement between said image FMx' and said mark Rbx increases. The photoelectric signals obtained from the detectors 25a, 25b in response to said light amount are processed in a processing unit 27 in synchronization with the position signal of the wafer stage 7. Thus the processing unit 27 sends signals Sa, Sab as shown in FIG. 18 to the main control unit 40. Since the light divider 25x divides the illuminating light into two beams at the position $E_{px}$ substantially conjugate with the pupil Ep of the projection lens 6 as shown in FIG. 15, the principal rays of thus divided beams $E_{xa}$, $E_{xb}$ are symmetrically inclined with respect to the optical axis of said projection lens 6. Consequently, when the reference member 10 is placed at a predetermined position (coordinate value $Z_1$ in FIG. 19), the image position of the projection lens 6 at the reticle side is shifted in the X-direction on the pattern of the test reticle TR. Thus the main control unit 40 detects and stores the coordinate values $X_1$, $X_2$ of the positions a, b shown in FIG. 19 where the projected images FMx' formed by the illuminating light beams $E_{xa}$, $E_{xb}$ obtained by the light divider 25x respectively coincide with the mark Rbx, or the bottom positions of the signals Sa, Sb in FIG. 18. Lines A, B in FIG. 19 indicate the relationship between the focus position and the position of coincidence. The crossing point of said lines A, B represents the focused position, and the inclinations of said lines A, B correspond to those of the principal rays of the illuminating light beams $E_{xa}$, $E_{xb}$. Thus the main control unit 40 calculates the amount of defocus between the test reticle TR and the reference member 10 from the aforementioned equation (1), and stores said defocus amount $\Delta Z_{bs}$.

Subsequently the main control unit 40 determines the defocus amount $\Delta Z_{bm}$ in the Y-direction in a similar manner utilizing the mark $R_{by}$ extended in the X-direction and the second focus position detecting system 26. Thus the main control unit determines the amount of defocus at the position of the reticle mark Rb, based on the defocus amounts $\Delta Z_{bs}$, $\Delta Z_{bm}$ in the sagittal direciton (for example X-direction) and in the meridional direction (for example Y-direction) with the marks Rbx, Rby shown in FIG. 14, for example by taking the average of said defocus amounts. In addition the main control unit 40 detects the defocus amounts in the sagittal and meridional directions in a similar manner on each of the reticle marks Ra, Rc, Rd and Re shown in FIG. 15, determines the exact defocus amounts ΔZa, ΔZc, ΔZd and ΔZe at the positions of said reticle marks, and stores these values as the defocus amounts when the heat accumulated in the projection lens is approximately zero.

Then the main control unit 40 opens the unrepresented rotary shutter, thereby introducing the exposing light into the projection lens 6, and detects the defocus amounts for each of the reticle marks Ra-Re of the test reticle TR at suitable heat accumulation levels under the irradiation of the exposing light through the projection lens 6, thus determining the defocus amounts at the positions of the reticle marks Ra-Re at said heat accumulation levels. The amount of heat accumulation in the projection lens 6 is determined by the main control unit 40 from the output signal of the detector 22 (irradiation energy per unit time) and the period of irradiation (period of opening of the rotary shutter). Thus there are obtained, as shown in FIG. 20, curves A(t), B(t), C(t), D(t) and E(t) indicating the relation between the heat accumulation and the amount of defocus respectively at the positions of the reticle marks Ra-Re.

The main control unit 40 stores said curves in a memory 28 either in the form of a mathematical function if said curve can be approximated by a function, or in the form of a table of numerical data if such approximation is not possible. It then detects the defocus amount at the position of at least a reticle mark, for example the defocus amount $\Delta Z_{bs}$ at the position of the mark Rbx, thereby enabling to detect the defocus amount ΔZb in consideration of the offset resulting from the astigmatism of the projection lens 6 at said mark position, and likewise enables the defocus amounts ΔZa, ΔZc, ΔZd and ΔZe at the positions of other four reticle marks Ra, Rc, Rd and Re.

Figure 20:
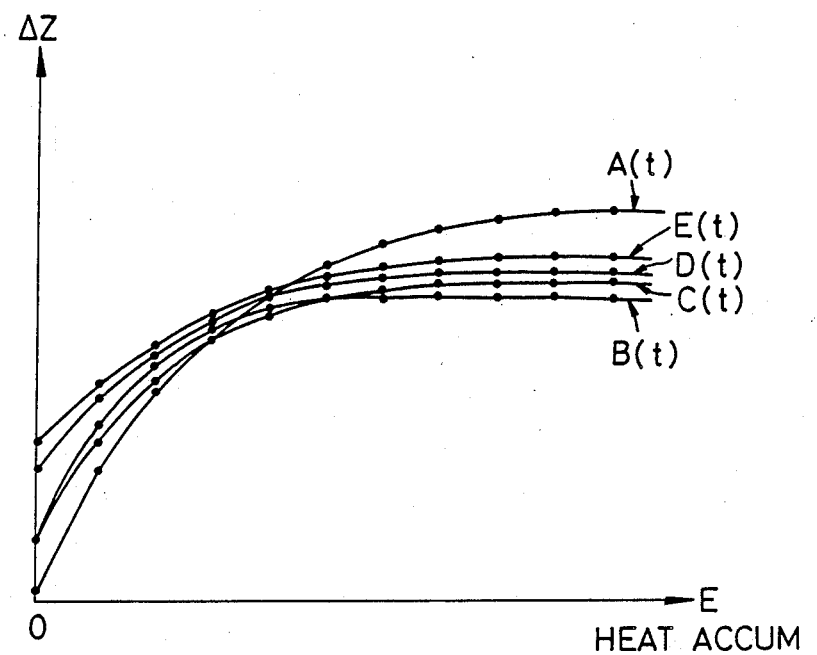
FIG. 20 is a chart showing the change in the image plane resulting from a temperature change in the projection lens.

In this manner there is completed the storage, in the memory 28, of the data (on the characteristic of variation in the focus position) to be employed in the focusing in the Z-direction, namely the defocus amount ΔZ at the position of each reticle mark corresponding to the heat accumulation E as shown in FIG. 20.

The transmittance of the test reticle TR or the reticle R varies depending on the form of the circuit pattern formed in the pattern area Pa, and the irradiation energy entering the projection lens 6 per unit time varies according to said transmittance and eventual attenuation of the exposure light source. For this reason, in the actual exposure, there will result a deviation from the characteristic of variation in the focus position detected in the above-mentioned manner. Consequently, at the use of the test reticle TR, the irradiating energy $K_1$ entering the projection lens 6 per unit time is measured with the detector 22 and stored in the memory 28.

Figure 12:
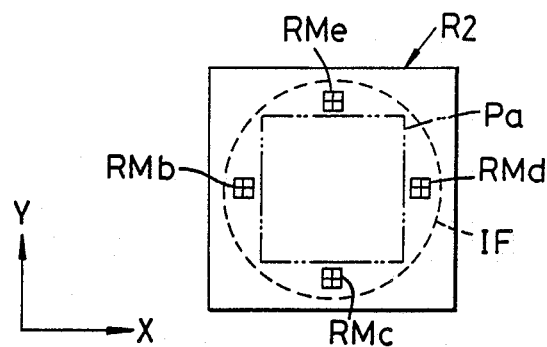
FIG. 12 is a schematic plan view of a device reticle to be employed in the embodiment shown in FIG. 11.

Then, in place for the above-mentioned test reticle TR, the reticle R2 provided with the alignment marks RMb-RMe shown in FIG. 12 is placed on the reticle stage 5. The irradiating energy $K_2$ entering the projection lens 6 per unit time is measured with the detector 22, and a correction constant K is calculated as a ratio $K_2/K_1$ and stored in the memory 28. Then said correction constant K is used for correcting the characteristic of variation, by multiplying the amount of variation by K, and thus multiplied values are stored in the memory 28.

Then the alignment mark RMb of the reticle R2, corresponding to the reticle mark Rb of the test reticle TR is used for detecting the defocus amount ΔZb in the rectangular mark extended in the Y-direction, in the above-explained manner. Thus the defocus amounts ΔZc, ΔZd and ΔZe at the positions of the alignment marks Rc, Rd and Re, and the defocus amount ΔZa at the center of the reticle R2 are determined from the values stored in the memory 28, based on the detected defocus amount $\Delta Z_{bs}$ and the focus variation characteristic multiplied by K, stored in the memory 28.

Subsequently, the amount of defocus ΔZ with respect to the best focus position, in consideration of the image plane curvature of the projection lens 6, is determined from the following equation (2), based on the defocus amounts ΔZa-ΔZe at different positions:

$$\Delta Z = \left( \Delta Za + \frac{\Delta Zb + \Delta Zd}{2} \right)/2 \qquad (2)$$

Also inclinations $\Delta \theta_x$, $\Delta \theta_y$ of the image plane along the X- and Y-directions are determined from the following equations (3) and (4):

$$\Delta \theta_x = \tan^{-1}\left[\left(\frac{\Delta Zc + \Delta Ze}{2} - \Delta Zb\right)/l\right] \qquad (3)$$

$$\Delta \theta_y = \tan^{-1}\left[\left(\frac{\Delta Zb + \Delta Zd}{2} - \Delta Zc\right)/l\right] \qquad (4)$$

wherein l is the distance from the center of the reticle R2 to the alignment marks RMb-RMe.

Then the main control unit 40 moves the wafer stage 7 by the defocus amount ΔZ in the Z-direction by means of the actuator 9, and tilts the levelling stage 7A through the actuator 21 in such a manner that the detected values of the horizontal position detecting system 32 in the exposure area on the wafer W in the X- and Y-directions respectively correspond to the image plane inclinations $\Delta \theta_x$ and $\Delta \theta_y$. Thus the exposure area on the wafer is positioned conjugate with the reticle R2 with respect to the projection lens 6, and insufficient resolution resulting from the image plane curvature or image plane inclination of the projection lens 6 is prevented. In this manner the alignment in the Z-direction, or the focusing operation, is completed. The precision of the alignment in the Z-direction can be improved by determining the defocus amount ΔZ by averaging the defocus amounts ΔZb-ΔZe corresponding to the alignment marks RMb-RMe and the defocus amount ΔZa at the center, and adjusting the position of the exposure area of the wafer W accordingly.

A prolonged exposure operation varies the state of the image plane of the projection lens 6 according to the amount of heat accumulation, eventually resulting in insufficient resolution. Therefore, in an extended exposure operation, the defocus amount ΔZbs is detected as explained above, utilizing the rectangular mark, extended in the Y-direction, of an arbitrary alignment mark, for example the alignment mark RMb. If said defocus amount ΔZbs exceeds a predetermined tolerance, the defocus amounts at the positions of the alignment marks are determined from said defocus amount ΔZbs and the data stored in the memory 28, and the defocus amount ΔZ and the image plane inclinations $\Delta \theta_x$, $\Delta \theta_y$ are calculated from the equations (2)-(4), based on thus determined defocus amounts. Then the main control unit 40 accordingly sends suitable instructions to the actuators 9, 21, thereby setting the exposure area of the wafer W in the test exposure position. The alignment in the Z-direction can be achieved according to the change in the image plane resulting from the heat accumulation in the projection lens 6, by suitable repeating the above-explained operation.

In the second embodiment of the present invention explained above, there is employed a test reticle provided with reticle marks each composed of rectangular marks respectively extended in the sagittal and meridional directions, and the focus positions in the sagittal and meridional directions at plural points in the exposure field are detected at suitable levels of heat accumulation. Thus the characteristic of variation in the focus positions in the sagittal and meridional directions, resulting from the heat accumulation, is stored in the memory. In the exposure operation, the state of image plane of the projection lens (image plane curvature, image plane inclination etc.) is calculated from the focus position in the sagittal or meridional direction, detected with at least an alignment mark formed on the device reticle, and the variation characteristic of the focus position stored in the memory 28. As the surface of the exposure area on the wafer is controlled at the best focus position, following the variation in the state of image plane, the exposure can always be conducted in the best focus state, avoiding insufficient resolution resulting from defocus or image plane curvature.

In the foregoing second embodiment, the focus position is detected with the first and second focus position detecting systems 25, 26, but the use of such two detecting systems is not essential. For example, it is evidently possible to obtain similar effects with a detecting system by providing a light divider in a position substantially conjugate with the pupil Ep of the projection lens 6 so as to divide the image Ep' of the projection lens 6 in a direction of 45° with respect to the X and Y-axes and also providing two detectors for respectively receiving the two light beams divided by said light divider Also said second embodiment calculates the defocus amount ΔZ and the amounts Δθx, Δθy of image plane curvature according to the equation (2) to (4), based on the defocus amount ΔZbs (or ΔZbm) detected in the sagittal (or meridional) direction at leat at an alignment mark (for example RMb) and the data stored in the memory 28. It is also possible, however, to replace the above-mentioned defocus amount with the amount E of heat accumulation from the output signal of the detector 22 (irradiation energy per unit time) and the period of opening of the rotary shutter, and to determine the defocus amount ΔZ and the amounts Δθx, Δθy of image plane curvature from the equations (2) to (4), based on said amount E of heat accumulation and the data stored in the memory 28.

What is claimed is:

1. A projection exposure apparatus for projecting the image of an object on a first plane onto a second plane through a projection optical system, comprising:

reference mark means provided in the vicinity of said second plane;

illumination means for illuminating said reference mark means from a side opposite to said projection optical system with respect to said second plane;

separation means for separating an illuminating light beam, transmitted by said reference mark means and forming the image of said reference mark means in the vicinity of said first plane through said projection optical system, into two light beams respectively passing through mutually different two areas in the pupil of said projection optical system;

detection means comprising at least a pair of light receiving elements respectively receiving said light beams separated by said separation means and releasing signals corresponding to the intensities of said light beams; and position control means for detecting the position of the image plane of said projection optical system with respect to said reference mark means, based on the output signals of said detection means, and varying the optical path length between said first plane and said reference mark means.

2. An apparatus according to claim 1, wherein said separation means comprises polarizing means provided at a position conjugate with said pupil of said projection optical system and adapted for varying, between said two light beams, the polarization characteristics of said illuminating light beam irradiating said reference mark means, and means for dividing said illuminating light beam into polarized lights of mutually different characteristics; and said detection means comprises two light-receiving elements respectively provided on the light paths of said divided two light beams of different polarization characteristics.

3. An apparatus according to claim 2, wherein said illumination means comprises a light source, and a condenser lens for concentrating the light beam from said light source onto said reference mark means, wherein said polarizing means is composed of two polarizing plates provided on a light path between said light source and said condenser lens and adapted to differentiate the direction of polarization in the light beams respectively passing through said two areas on said pupil.

4. An apparatus according to claim 3, wherein said polarizing means is formed by mutually uniting edges of said two polarizing plates in such a manner that a light beam transmitted by a polarizing plate passes through a divided area obtained by substantially equalling dividing said pupil into two areas, and a light beam transmitted by the other polarizing plate passes through the other divided area.

5. An apparatus according to claim 3, wherein said polarizing means has four sectors for dividing the light beam emitted from said light soruce into four portions, in which said sectors have mutually opposed two opaque sectors and mutually opposed two polarizing sectors of different polarizing characteristics.

6. An apparatus according to claim 1, wherein said separation means comprises a dividing optical member positioned at a position on the optical path of the illuminating light beam transmitted by said first plane and substantially conjugate with the pupil of said projeciton optical system and adapted to divide the image of pupil of said projection optical system, and said detection means comprises plural light-receiving elements for respectively receiving the light beams divided by said dividing optical member.

7. A projection exposure apparatus for projecting the image of an object on a first plane onto a second plane through a projection optical system, comprising:

reference mark means provided in the vicinity of said second plane;

illumination means for illuminating said reference mark means from a side opposite to said projection optical system with respect to said second plane;

separation means provided at a position in the optical path of the illuminating light beam transmitted by said reference mark means, said projection optical system and said first plane and substantially conjugate with the pupil of said projection optical system, and adapted to separate said illuminating light beam into two light beams respectively passing through mutually different two areas in said pupil;

detection means comprising at least a pair of light receiving elements respectively receiving said light beams separated by said separation means and releasing signals corresponding to the intensities of said light beams;

position control means for detecting the position of the image plane of said projection optical system with respect to said reference mark means, based on the output signals of said detection means, and varying the optical path length between said first plane and said reference mark means;

memory means for storing, in advance, the variation characteristics, in the axial direction, of plural points in the image plane of said projection optical system, corresponding to the amount of heat accumulation in said projection optical system resulting from the ray of energy entering thereinto; and means for determining the position, in the direction of optical axis, of said image plane of said projection optical system, based on said variation characteristics stored in advance in said memory means.

8. An apparatus according to claim 7, wherein said separation means comprises a separating optical member provided at a position on the optical path of the illuminating optical light beam transmitted by said first plane and substantially conjugate with the pupil of said projection optical system, and adapted to divide the image of the pupil of said projection optical system, and said detection means comprises two light-receiving elements for respectively receiving two light beams divided by said deviding optical member.

9. An apparatus according to claim 7, further comprising a beam splitter provided on the light path of the illuminating light beam transmitted by said reference mark means, said projection optical system and said first plane and adapted to effect amplitude division of said illuminating light beam;

wherein said separation means comprises a first dividing optical member provided at a position on the optical path of one of the illuminating light beams divided by said beam splitter and substantially conjugate with the pupil of said projection optical system, and adapted to divide the image of the pupil of said projection optical system; and a second dividing optical member positioned on the path of the other of said light beams and adapted to divide the image of the pupil of said projection optical system, and said detection means comprises first and second light-receiving elements for respectively receiving the light beams divided by said first dividing optical member, and third and fourth light-receiving elements for respectively receiving the light beams divided by said second dividing optical member.

10. A projection exposure apparatus comprising:

a projection optical system for projecting the image of an object on a first plane onto a second plane;

means having an emission aperture in the vicinity of said second plane and adapted to emit an imaging light beam from said emission aperture toward said first plane through said projection optical system, said imaging light beam being converged in the vicinity of said first plane by said projection optical system;

means for separating said imaging light beam into first and second light beams respectively passing through mutually different first and second areas in the pupil of said projection optical system;

detection means comprising first and second light-receiving elements respectively provided on the paths of said first and second light beams and adapted to generate output signals respectively corresponding to the amounts of received light;

means for regulating said emitting means thereby regulating the inclination of the principal rays of said first and second light beams in the crossing positions thereof with said first plane; and means for determining the converging position of said imaging light beam, based on the output signals of said first light-receiving element obtained with mutually different inclinations of the principal ray of said first light beam, and output signals of said second light-receiving elements obtained with mutually different inclinations of the principal ray of said second light beam.

* * * * *